US012757348B2

(12) United States Patent
Su et al.

(10) Patent No.: US 12,757,348 B2
(45) Date of Patent: Oct. 6, 2026

(54) STORAGE DEVICE AND CABINET HAVING THE SAME

(71) Applicant: Fulian Precision Electronics (Tianjin) Co., LTD., Tianjin (CN)

(72) Inventors: Chen-Hao Su, New Taipei (TW); Fang-Xing Yang, Tianjin (CN); Liang Gao, Tianjin (CN); Kun-Yang Cheng, New Taipei (TW); Kai-Sheng Chang, New Taipei (TW); Wen-Tzu Chen, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 134 days.

(21) Appl. No.: 18/960,024

(22) Filed: Nov. 26, 2024

(65) Prior Publication Data

US 2025/0393155 A1 Dec. 25, 2025

(30) Foreign Application Priority Data

Jun. 25, 2024 (CN) ......................... 202410830892.1

(51) Int. Cl.
*G06F 1/16* (2006.01)
*H05K 7/14* (2006.01)

(52) U.S. Cl.
CPC .................................. *H05K 7/1489* (2013.01)

(58) Field of Classification Search
CPC .. H05K 7/1487; H05K 7/1488; H05K 7/1489; H05K 7/1491
See application file for complete search history.

(56) References Cited

U.S. PATENT DOCUMENTS

2013/0342990 A1* 12/2013 Jau ............................ G06F 1/18
361/679.39
2019/0166713 A1* 5/2019 Chen .................. H01R 12/7076
2021/0251100 A1* 8/2021 Russell ................ G11B 33/126
2022/0124933 A1* 4/2022 Li ........................ H05K 7/1489
2023/0026480 A1* 1/2023 Wu ...................... H05K 7/1491

* cited by examiner

*Primary Examiner* — Anthony Q Edwards
(74) *Attorney, Agent, or Firm* — ScienBiziP, P.C.

(57) ABSTRACT

A storage device includes a housing, a first storage body, a second first storage body, a first structural assembly and a second structural assembly. The housing includes a bottom wall and sidewalls connected to the bottom wall. The first storage body is slidably connected to the sidewalls and can receive a first module. The second storage body is slidably connected to the sidewalls and can receive a second module. The first structural assembly is located in a first gap between the second storage body and the bottom wall, and connected to the first storage body and the bottom wall. The first structural assembly partially receives cables of the first module and can unfold. The second structural assembly is located in the first gap and connected to the second storage body and the bottom wall. The second structural assembly partially receives cables of the second module and can unfold.

20 Claims, 13 Drawing Sheets

STORAGE DEVICE AND CABINET HAVING THE SAME

FIELD

The subject matter herein generally relates to cabinets, and more particularly, to a storage device and a cabinet having the storage device.

BACKGROUND

A cabinet may have a cabinet body and servers slidably located in the cabinet body. The server may have a number of cables. When the server is pulled out of the cabinet body under an external force, the cables may become tangled. The tangled cables will prevent the server from moving back to its original position, and forcing the server back to the original position may cause damages to the cables.

Therefore, there is a room for improvement in the art.

BRIEF DESCRIPTION OF THE DRAWINGS

Implementations of the present technology will now be described, by way of embodiment, with reference to the attached figures.

DETAILED DESCRIPTION

Figure 1:
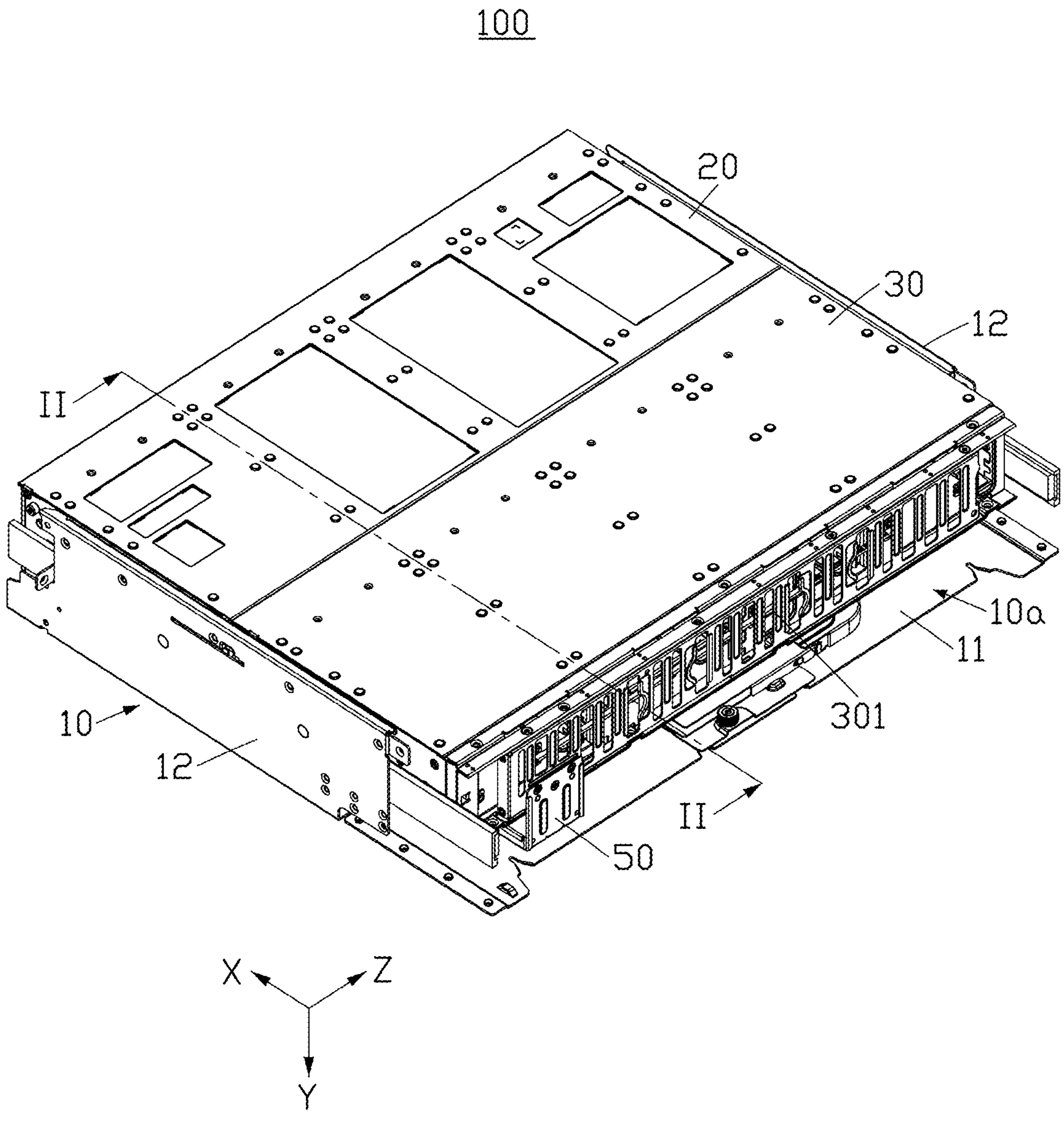
FIG. 1 is a diagrammatic view of a storage device in a folded state according to an embodiment of the present disclosure.

It will be appreciated that for simplicity and clarity of illustration, where appropriate, reference numerals have been repeated among the different FIG.s to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIGS. 1 to 5, a storage device 100 is provided according to an embodiment of the present disclosure. The storage device 100 includes a housing 10. The housing 10 includes a bottom wall 11 and two sidewalls 12 are connected to the bottom wall 11. The two sidewalls 12 are opposite to each other.

Figure 2:
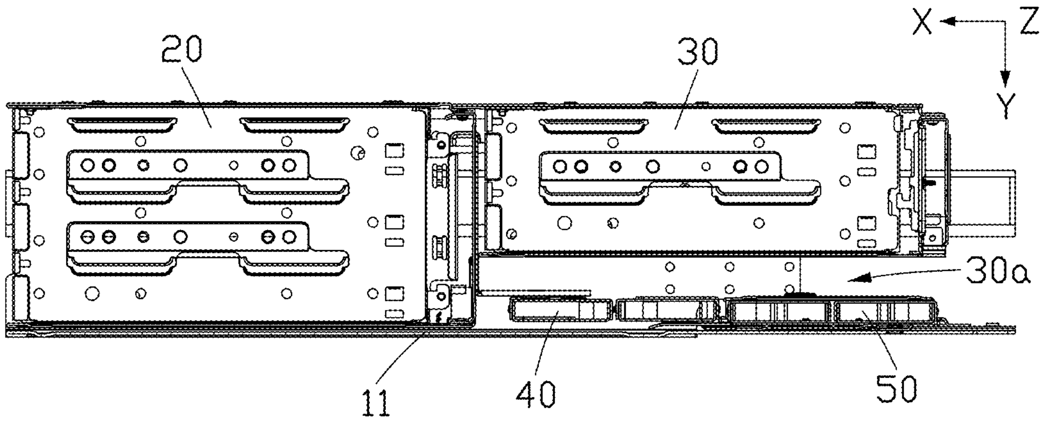
FIG. 2 a cross-sectional view of the storage device shown in FIG. 1, viewed along a view line II-II.
Figure 3:
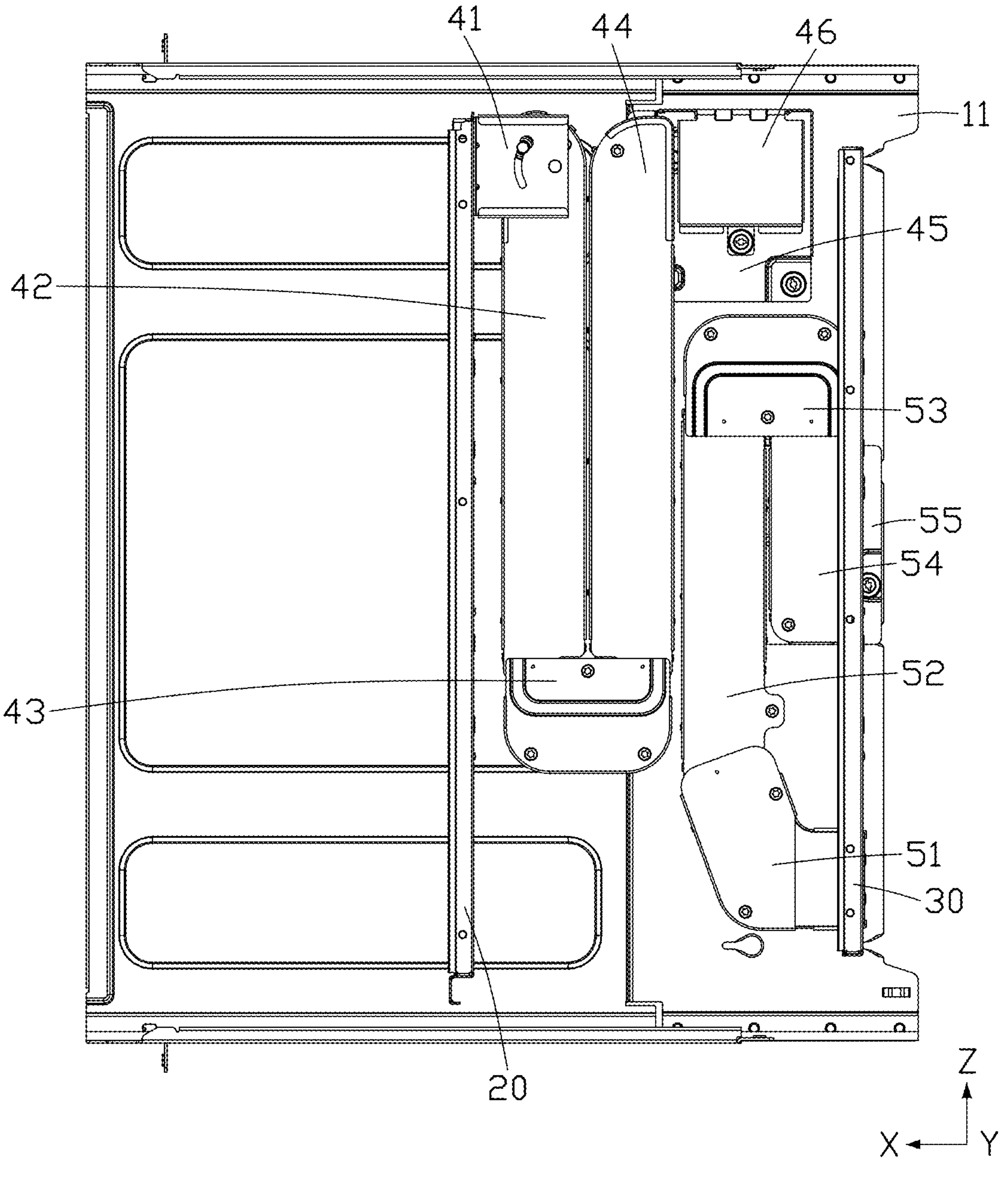
FIG. 3 is a diagrammatic view of a first structural assembly and a second structural assembly of the storage device of FIG. 1.
Figure 8:
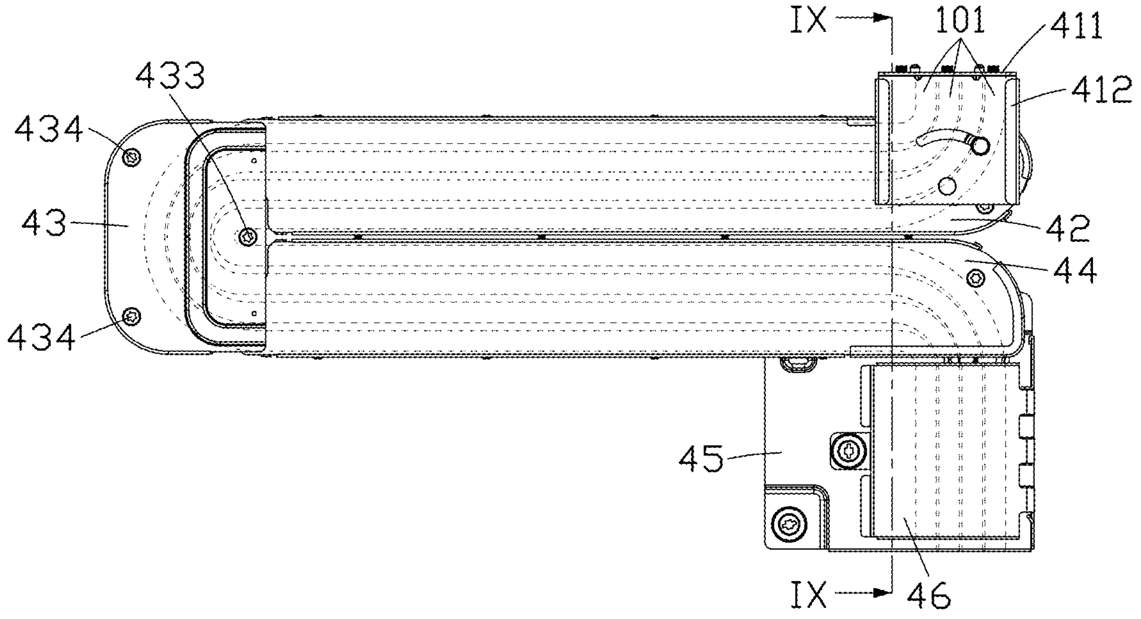
FIG. 8 is a diagrammatic view showing first cables located in the first structural assembly of FIG. 6.
Figure 9:
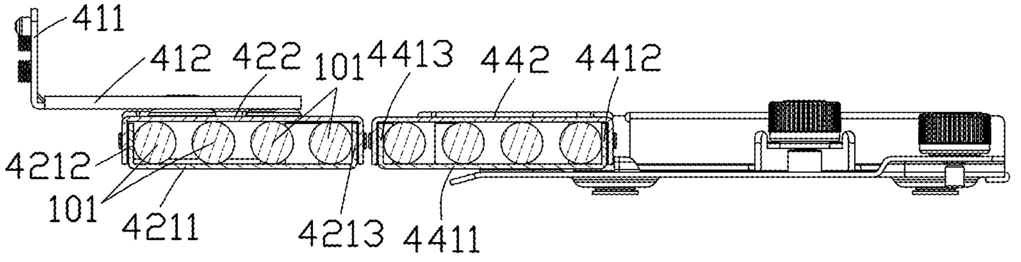
FIG. 9 is a cross-sectional view of the first structural assembly shown in FIG. 8, viewed along a view line VIIII-VIIII.

In at least one embodiment, the receiving device 100 further includes a first storage body 20 slidably connected to the sidewalls 12. The first storage body 20 is used to install a first module 201, and the first module 201 includes a number of first cables 101 (shown in FIGS. 8 and 9). The storage device 100 further includes a second storage body 30 slidably connected to the sidewalls 12. The second storage body 30 is used to install a second module 301, and the second module 301 includes a number of second cables 102 (shown in FIG. 12). The second storage body 30 and the first storage body 20 are arranged along a first direction X. The second storage body 30 and the bottom wall 11 are arranged along a second direction Y. The two sidewalls 12 are opposite to each other along a third direction Z. Each two of the first direction X, the second direction Y, and the third direction Z are perpendicular to each other. The bottom wall 11 and the sidewalls 12 cooperatively define a receiving chamber 10*a* (shown in FIG. 1). Referring to FIGS. 1 and 2, the first storage body 20 and the second storage body 30 are received in the receiving chamber 10*a*. Referring to FIG. 3, the first storage body 20 may be pulled, allowing the first storage body 20 to protrude from the receiving chamber 10*a*. The second storage body 30 may also be pulled, thereby allowing the second storage body 30 to partially protrude from the receiving chamber 10*a*.

Referring to FIG. 2, a first gap 30*a* is defined between the second storage body 30 and the bottom wall 11 along the second direction Y. The storage device 100 further includes a first structural assembly 40 located in the first gap 30*a*. The first structural assembly 40 is connected to the first storage body 20 and the bottom wall 11. Each first cable 101 is partially located in the first structural assembly 40. The first structural assembly 40 may be unfolded when the first storage body 20 moves along the first direction X away from the second storage body 30. The storage device 100 further includes a second structural assembly 50 located in the first gap 30*a*. The second structural assembly 50 is connected to the second storage body 30 and the bottom wall 11. Each second cable 102 is partially located in the second structural assembly 50. The second structural assembly 50 is unfolded when the second storage body 30 moves along the first direction X toward the first storage body 20.

In the present disclosure, the first structural assembly 40 receives a portion of each of the first cables 101 therein, which reduces the tangle of and damages to the first cables 101 when the first storage body 20 moves along the first direction X (e.g., when the first storage body 20 is pulled along the first direction X), thereby protecting the first cables 101. The second structural assembly 50 receives a portion of each of the second cables 102 therein, which reduces the tangle of and damages to the second cables 102 when the second storage body 30 moves along the first direction X, thereby protecting the second cables 102. The first cables 101 and the second cables 102 may extend through the first gap 30*a* to connect an external component (not shown). By placing the first structural assembly 40 and the second structural assembly 50 in the first gap 30*a*, the space utilization is improved.

Figure 4:
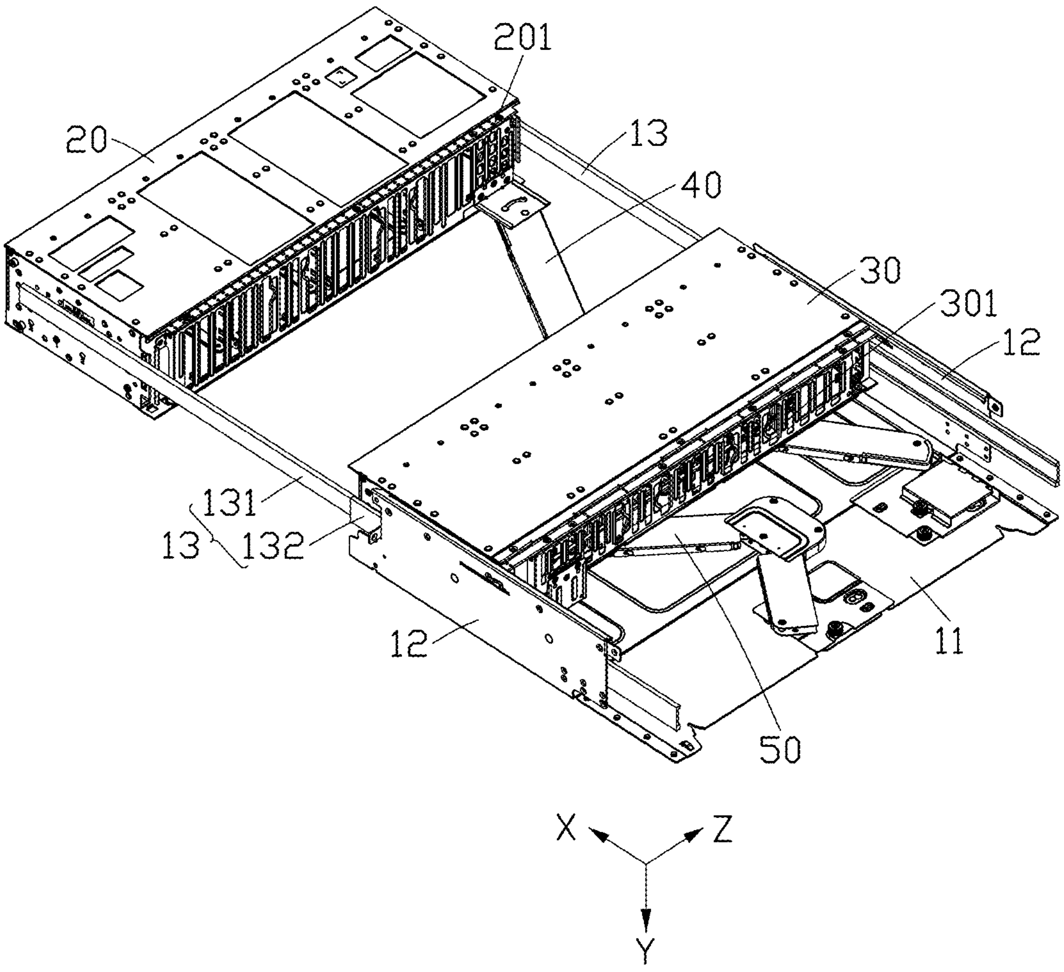
FIG. 4 is similar to FIG. 1, but showing the storage device in an unfolded state.
Figure 5:
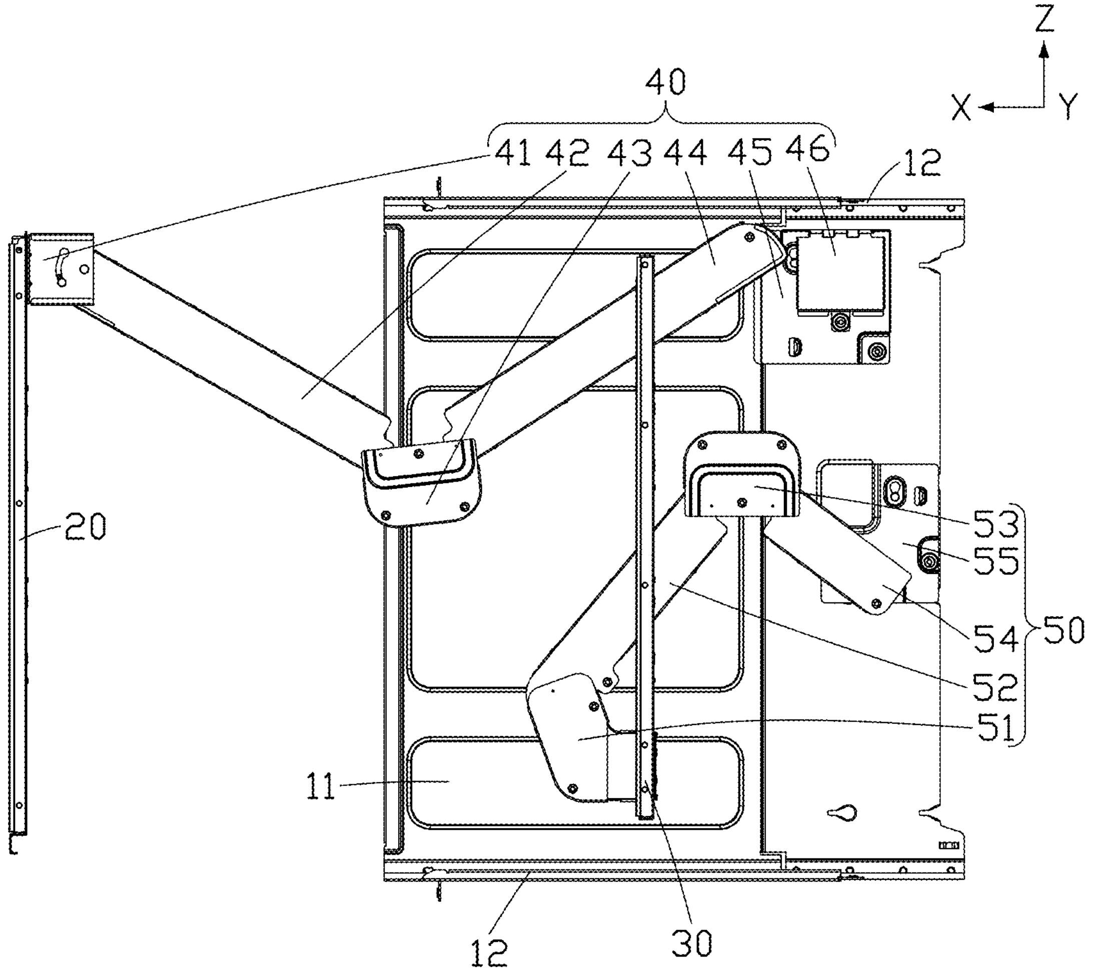
FIG. 5 is a diagrammatic view of the first and the second structural assemblies of the storage device of FIG. 4.
Figure 6:
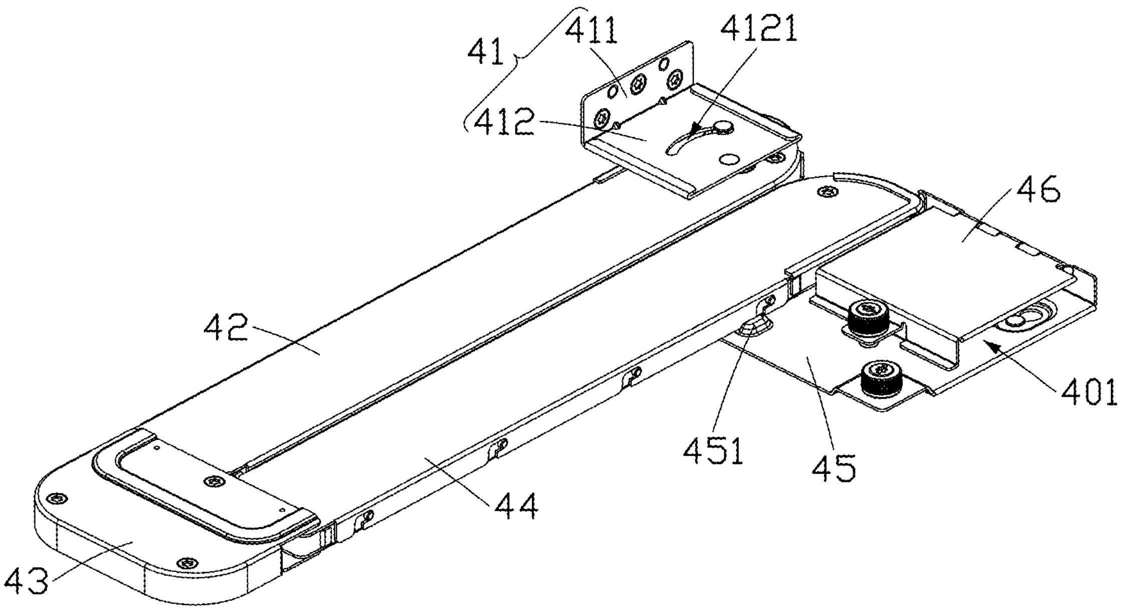
FIG. 6 is a diagrammatic view of the first structural assembly of FIG. 3.
Figure 7:
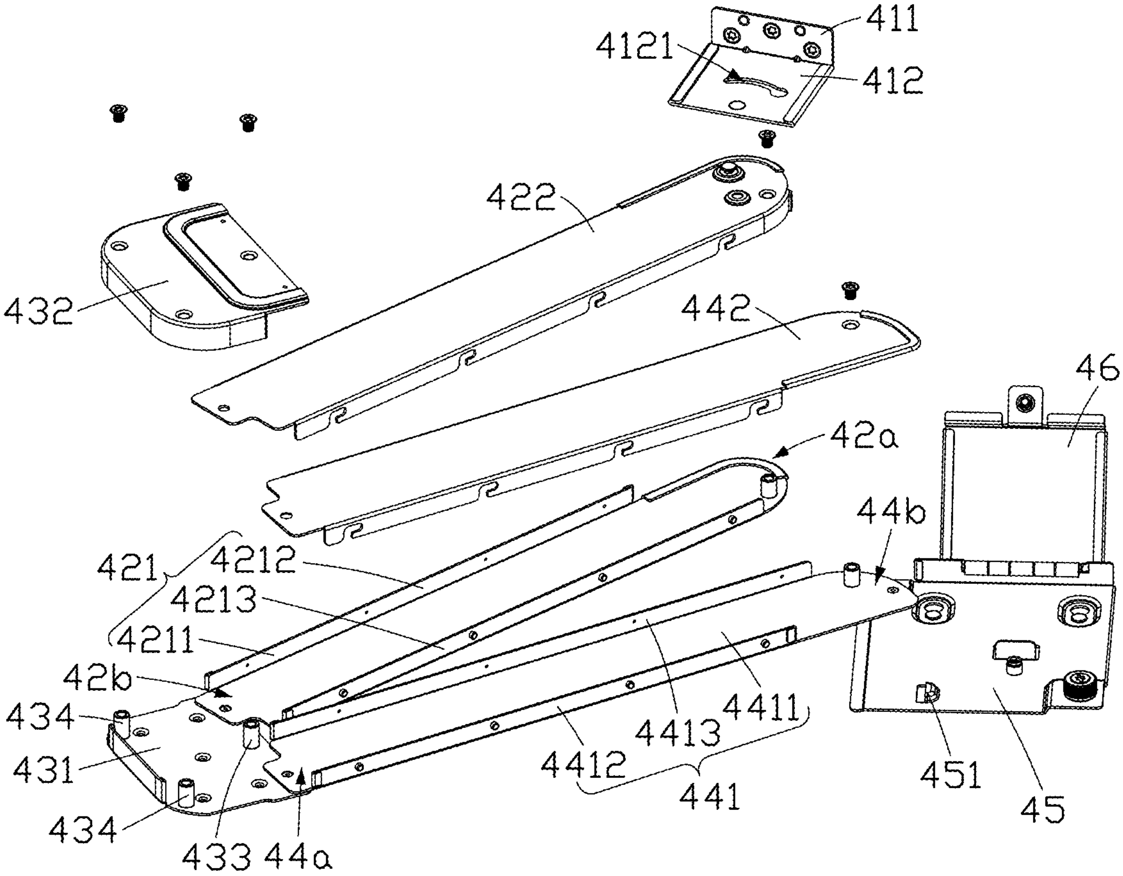
FIG. 7 is an exploded view of the first structural assembly of FIG. 6.

Referring to FIG. 4, in at least one embodiment, the housing 10 further includes a sliding rail 13 fixed to an inner side of each sidewall 12. Each of the first storage body 20 and the second storage body 30 is connected to the sliding rail 13. The sliding rail 13 may include a first section 131 and a second section 132. The second section 132 is fixed to the sidewall 12, and the first section 131 is slidably connected to the second section 132. The second storage body 30 is slidably connected to the second section, and the first storage body 20 is fixed to the first section. By pulling the first storage body 20 to move along the first direction X, the first section 132 may be driven to slide with relative to the second section 132.

Referring to FIGS. 6 to 9, in at least one embodiment, the first structural assembly 40 includes a first fixing member 41 and a first connecting member 42. The first fixing member 41 is fixed to the first storage body 20, and the first connecting member 42 is rotatably connected to the first fixing member 41. In at least one embodiment, a width of the first connecting member 42 is greater than a thickness of the first connecting member 42. Thus, the first connecting member 42 may be flat and easily installed in the first gap 30*a*, thereby improving the space utilization.

The first fixing member 41 may include a first fixing portion 411 and a second fixing portion 412. The first fixing portion 411 may substantially be perpendicular to the second fixing portion 412. The first fixing portion 411 is fixed to the first storage body 20, and the second fixing portion 412 is connected to the first fixing portion 411. The second fixing portion 412 defines a curve groove 4121. A portion of the first connecting member 42 is slidably received in the curve groove 4121, thereby causing the first connecting member 42 to rotate relative to the second fixing member 412.

The first structural assembly 40 may further include a first adapter member 43 and a second connecting member 44. The first connecting member 42 is rotatably connected to the first adapter member 43. The second connecting member 44 is rotatably connected to the first adapter member 43 and the bottom wall 11. In at least one embodiment, a width of the second connecting member 44 is greater than a thickness of the second connecting member 44. Thus, the second connecting member 44 may be flat and easily installed in the first gap 30*a*, thereby improving the space utilization.

The first connecting member 42 includes a first base portion 421 and a first cover 422. The first cover 422 is connected to the first base portion 421. The first base portion 421 is rotatably connected to the first adapter member 43. The first cover 422 is rotatably connected to the first fixing member 41. A portion of the first cover 422 is slidably received in the curve groove 4121.

The first connecting member 42 defines a first opening 42*a* and a second opening 42*b* opposite to the first opening 42*a*. The first cables 101 extend into the first connecting member 42 from the first opening 42*a*. The first cables 101 protrude from the second opening 42*b* and further extend into the first adapter member 43.

The first base portion 421 includes a first base plate 4211, a first side plate 4212, and a second side plate 4213. Each of the first side plate 4212 and the second side plate 4213 is connected to the first base plate 4211. The first cables 101 are arranged between the first side plate 4212 and the second side plate 4213, which limit the position of the first cables 101.

In at least one embodiment, a length of the first side plate 4212 is smaller than a length of the second side plate 4213. The first opening 42*a* extends to the side of the first base portion 421 where the first side plate 4212 is located. Thus, the size of the first opening 42*a* is enlarged, which reduces the bending curvature of the first cables 101 and thus minimizes damages to the first cables 101.

The first cables 101 are laid flat between the first cover 422 and the first base portion 421. The first cover 422 and the first base portion 421 may limit the movement of the first cables 101 along the second direction Y, and prevent the first cables 101 from stacking on each other along the second direction Y, which facilitates the management of the first cables 101. Thus, during the folding and unfolding processes of the first structural assembly 40, damages to the first cables 101 are reduced.

The second connecting member 44 includes a second base portion 441 and a second cover 442. The second cover 442 is connected to the second base portion 441. The second base portion 441 is rotatably connected to the first adapter member 43. At least one of the second base portion 441 and the second cover 442 is rotatably connected to the bottom wall 11. For example, the second base portion 441 is rotatably connected to the bottom wall 11.

The second connecting member 44 defines a third opening 44*a* and a fourth opening 44*b*. The second cables 102 extend into the second connecting member 44 from the third opening 44*a*. The second cables 102 further protrude from the second connecting member 44 through the fourth opening 44*b*.

The second base portion 441 includes a second base plate 4411, a third side plate 4412, and a fourth side plate 4413. Each of the third side plate 4412 and the fourth side plate 4413 is connected to the second base plate 4411. The second cables 102 are arranged between the third side plate 4412 and the fourth side plate 4413, which limit the position of the second cables 102.

In at least one embodiment, a length of the third side plate 4412 is smaller than a length of the fourth side plate 4413. The fourth opening 44*b* extends to the side of the second base portion 441 where the third side plate 4412 is located. Thus, the size of the fourth opening 44*b* is enlarged, which reduces the bending curvature of the second cables 102 and thus minimizes damages to the second cables 102.

The second cables 102 are laid flat between the second cover 442 and the second base portion 441. The second cover 442 and the second base portion 441 may limit the movement of the second cables 102 along the second direction Y, and prevent the second cables 102 from stacking on each other along the second direction Y, which facilitates the management of the second cables 102. Thus, during the folding and unfolding processes of the first structural assembly 40, damages to the second cables 102 are reduced.

The first adapter member 43 includes a first bottom plate 431 and a first cover plate 432. The first cover plate 432 is connected to the first bottom plate 431. The first base portion 421 is hinged to the first bottom plate 431. The second base portion 441 is hinged to the first bottom plate 431.

In at least one embodiment, the first adapter member 43 further includes a first limiting column 433. The first cables 101 are bent around the first limiting column 433, which may limit the first cables 101 within the first adapter member

43. Thus, during the folding and unfolding processes of the first structural assembly 40, damages to the first cables 101 are reduced.

The first adapter member 43 further includes two second limiting columns 434. The first limiting column 433 and two second limiting columns 434 are fixed to the first bottom plate 431. The first cables 101 protrude from the first connecting member 42, extend through the space between the first limiting column 433 and one of the second limiting columns 434, extend through the space between the first limiting column 433 and another of the second limiting columns 434, and enter the second connecting member 44. Thus, the first cables 101 are limited in the first adapter member 43. Thus, during the folding and unfolding processes of the first structural assembly 40, damages to the first cables 101 are further reduced. In at least one embodiment, when viewed along the second direction Y, the first limiting column 433 and the two second limiting columns 434 form three vertexes of a triangle.

In at least one embodiment, the first structural assembly 40 further includes a first base member 45. The first base member 45 is fixed to the bottom wall 11. The first base member 45 includes a first protrusion 451. When the first structural assembly 40 is folded, the first protrusion 451 is resisted against the second connecting member 44 to limit the position of the first structural assembly 40.

The first structural assembly 40 further includes a guiding member 46. One side of the guiding member 46 is rotatably connected to the first base member 45, and another side of the guiding member 46 is locked to the first base member 45. The guiding member 46 and the first base member 45 cooperatively define a first space 401 therebetween. The first cables 101 extend into the first space 401 from the fourth opening **44*b* and further protrude from the first space 401 to connect the external component. The guiding member 46 further reduces the tangle of and damages to the first cables 101. In at least one embodiment, the first cables 101 first extend from one side of the first storage body 20 facing the second storage body 30, sequentially enter the first connecting member 42, the first adapter member 43, and the second connecting member 44, and finally protrude from the first space 401** to connect the external component.

In at least one embodiment, a thickness of the first structural assembly 40 along the second direction Y is defined as h1, and 14 mm≤h1≤27 mm. For example, h1 may be, but not limited to 14 mm, 15 mm, 16 mm, 17 mm, 18 mm, 19 mm, 20 mm, 21 mm, 22 mm, 23 mm, 24 mm, 25 mm, 26 mm, or 27 mm. A height of the first gap **30*a* along the second direction Y is greater than or equal to the thickness h1 of the first structural assembly 40**.

Figure 10:
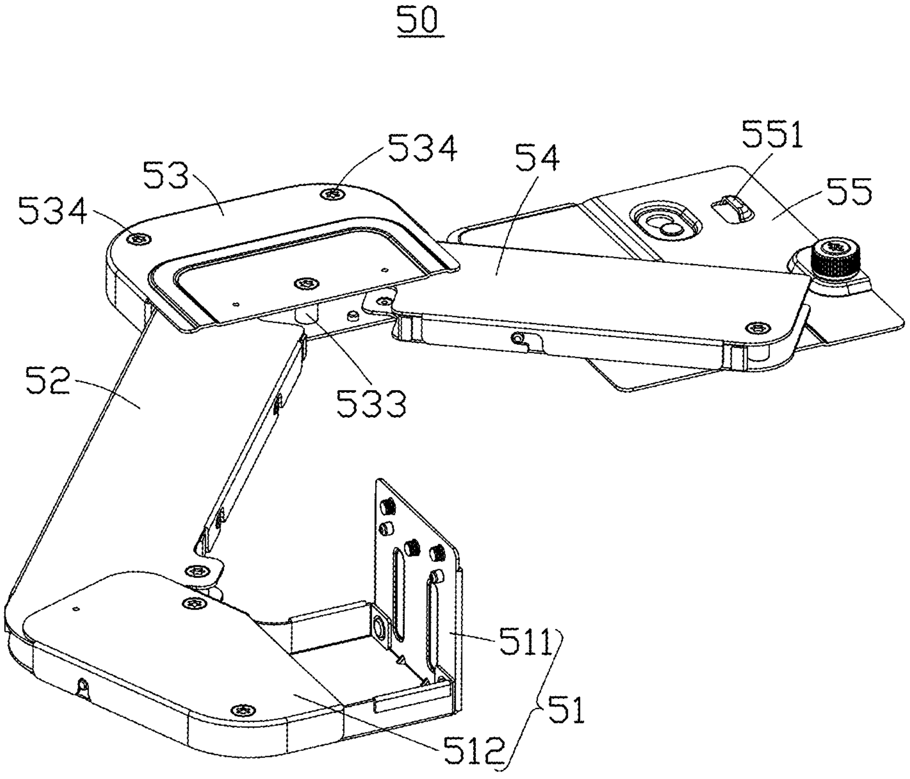
FIG. 10 is a diagrammatic view of the second structural assembly of FIG. 5.
Figure 11:
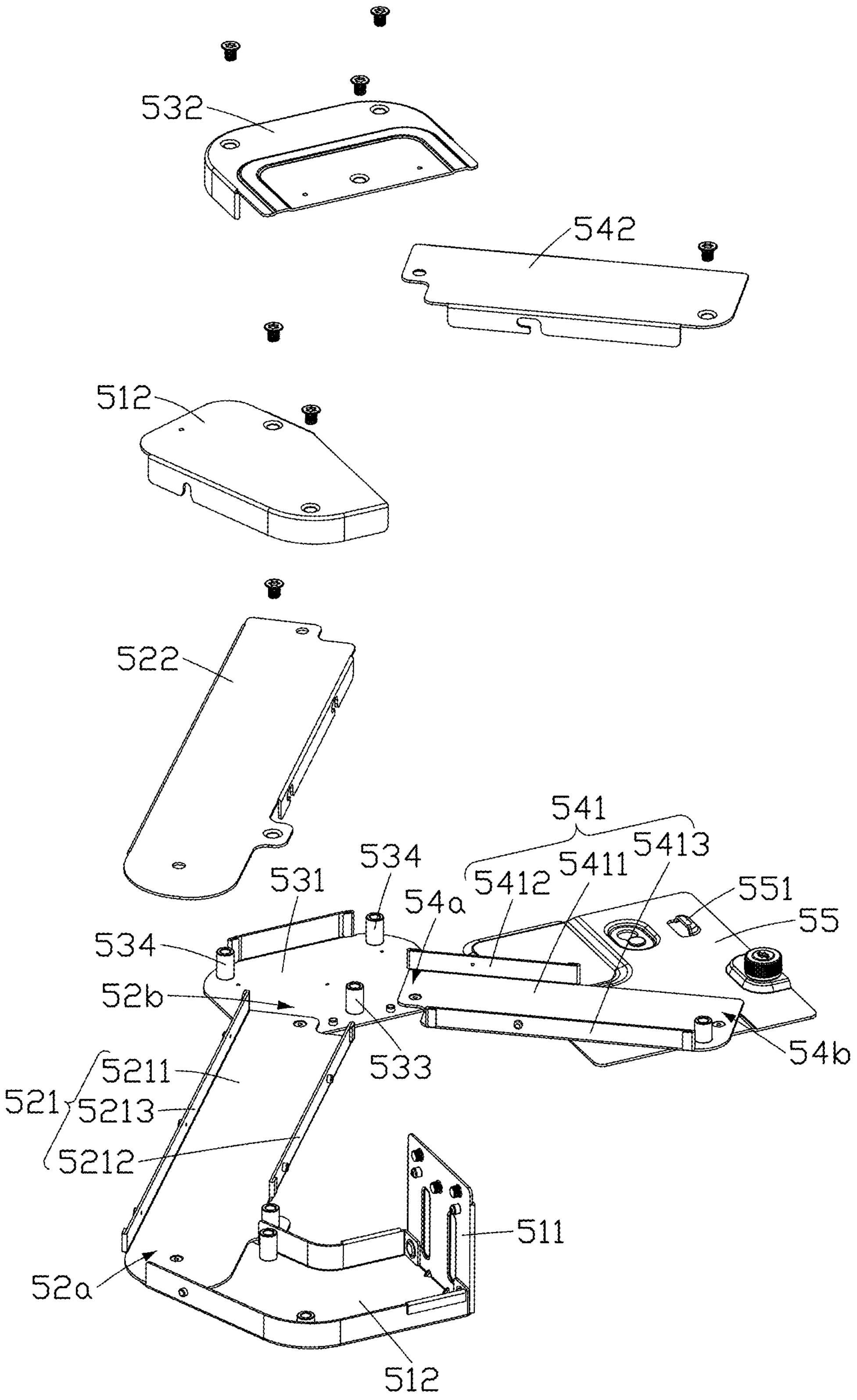
FIG. 11 is an exploded view of the second structural assembly of FIG. 10.
Figure 12:
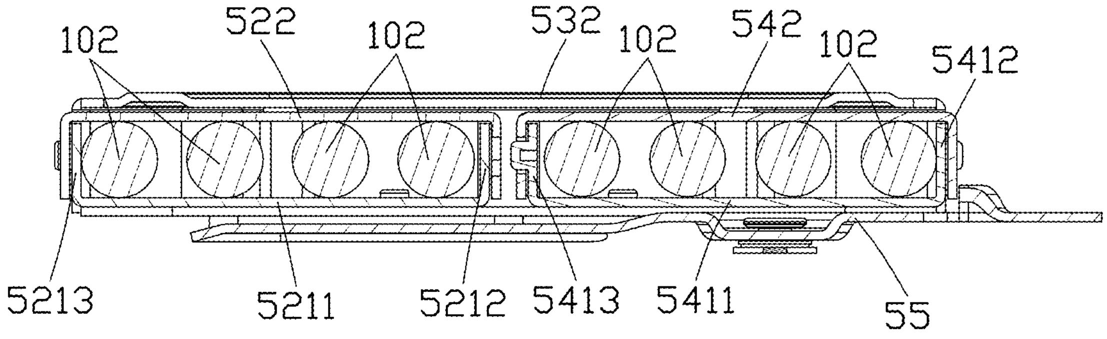
FIG. 12 is a cross-sectional view of the second structural assembly and second cables, when the second structural assembly of FIG. 10 is folded.

Referring to FIGS. 10 to 12, in at least one embodiment, the second structural assembly 50 includes a second fixing member 51 and a third connecting member 52. The second fixing member 51 is fixed to the second storage body 30, and the third connecting member 52 is rotatably connected to the second fixing member 51. In at least one embodiment, a width of the third connecting member 52 is greater than a thickness of the third connecting member 52. Thus, the third connecting member 52 may be flat and easily installed in the first gap **30*a***, thereby improving the space utilization.

The second fixing member 51 includes a third fixing portion 511 and a fourth fixing portion 512. The third fixing portion 511 is fixed to the second storage body 30, and the fourth fixing portion 512 is connected to the third fixing portion 511. The fourth fixing member 512 is spaced from the second storage body 30 along the second direction Y. The fourth fixing member 512 is rotatably connected to the third connecting member 52. The second cables 102 may enter the third connecting member 52 from the fourth fixing portion 512.

The second structural assembly 50 further includes a second adapter member 53 and a fourth connecting member 54. The third connecting member 52 is rotatably connected to the second adapter member 53. The fourth connecting member 54 is rotatably connected to the second adapter member 53 and the bottom wall 11. In at least one embodiment, a width of the fourth connecting member 54 is greater than a thickness of the fourth connecting member 54. Thus, the fourth connecting member 54 may be flat and easily installed in the first gap **30*a***, thereby improving the space utilization.

The third connecting member 52 includes a third base portion 521 and a third cover 522. The third cover 522 is connected to the third base portion 521. The third base portion 521 is rotatably connected to the second adapter member 53, and the third cover 522 is rotatably connected to the second fixed portion 51.

The third connection portion 52 defines a fifth opening **52*a* and a sixth opening 52*b*. The second cables 102 enter the third connecting member 52 from the fifth opening 52*a*, protrude from the third connecting member 52 through the sixth opening 52*b*, and enter the second adapter member 53**.

The third base portion 521 includes a third base plate 5211, a fifth side plate 5212, and a sixth side plate 5213. The fifth side plate 5212 and the sixth side plate 5213 are connected to the third base plate 5211 and opposite to each other. The second cables 102 are arranged between the fifth side plate 5212 and the sixth side plate 5213, which limit the position of the second cables 102.

In at least one embodiment, a length of the fifth side plate 5212 is smaller than a length of the sixth side plate 5213, and the fifth opening **52*a* extends to a side of the third base portion 521 where the fifth side plate 5212 is located. Thus, the size of the fifth opening 52*a* is enlarged, which reduces the bending curvature of the second cables 102 and thus minimizes damages to the second cables 102**.

In at least one embodiment, the second cables 102 are laid flat between the third cover 522 and the third base portion 521. The third cover 522 and the third base portion 521 may limit the movement of the second cables 102 along the second direction Y, and prevent the second cables 102 from stacking on each other along the second direction Y, which facilitates the management of the second cables 102. Thus, during the folding and unfolding processes of the second structural assembly 50, damages to the second cables 102 are reduced.

The fourth connecting member 54 includes a fourth base portion 541 and a fourth cover 542. The fourth cover 542 is connected to the fourth base portion 541. The fourth base portion 541 is rotatably connected to the second adapter member 53. At least one of the fourth base portion 541 and the fourth cover 542 is rotatably connected to the bottom wall 11. For example, the fourth base portion 541 is rotatably connected to the bottom wall 11.

In at least one embodiment, the fourth connecting member 54 defines a seventh opening **54*a* and an eighth opening 54*b*. The second cable 102 extend into the fourth connecting member 54 from the seventh opening 54*a*, and protrude from the fourth connecting member 54 through the eighth opening 54*b***.

The fourth base portion 541 includes a fourth base plate 5411, a seventh side plate 5412, and an eighth side plate 5413. The seventh side plate 5412 and the eighth side plate 5413 are connected to the fourth base plate 5411. The second cables 102 are arranged between the seventh side plate 5412 and the eighth side plate 5413, which limit the position of multiple second cables 102.

In at least one embodiment, a length of the seventh side plate 5412 is smaller than a length of the eighth side plate 5413. The eighth opening 54*b* extends to the side of the fourth connecting member 54 where the seventh side plate 5412 is located. Thus, the size of the eighth opening 54*b* is enlarged, which reduces the bending curvature of the second cables 102 and thus minimizes the damages to the second cables 102.

In at least one embodiment, the second cables 102 are laid flat between the fourth cover 542 and the fourth base portion 541. The fourth cover 542 and the fourth base portion 541 may limit the movement of the second cables 102 along the second direction Y, and prevent the second cables 102 from stacking on each other along the second direction Y, which facilitates the management of the second cables 102. Thus, during the folding and unfolding processes of the second structural assembly 50, damages to the second cables 102 is reduced.

In at least one embodiment, the second adapter member 53 includes a second bottom plate 531 and a second cover plate 532. The second cover plate 532 is connected to the second bottom plate 531. The third base portion 521 is hinged to the second bottom plate 531. The fourth base portion 541 is hinged to the second bottom plate 531.

In at least one embodiment, the second adapter member 53 includes a third limiting column 533. The second cables 102 are bent around the third limiting column 533, which may limit the second cables 102 within the second adapter member 53. Thus, during the folding and unfolding processes of the second structural assembly 50, damages to the second cables 102 are reduced.

The second adapter member 53 further includes two fourth limiting columns 534. The third limiting column 533 and the two fourth limiting columns 534 are fixed to the second bottom plate 531. The second cables 102 protrude from the third connecting member 52, extend through the space between the third limiting column 533 and one of the fourth limiting columns 534, extend through the space between the third limiting column 533 and another of the fourth limiting columns 534, and enter the fourth connecting member 54. Thus, the second cable 102 are limited in the second adapter member 53. Thus, during the folding and unfolding processes of the second structural assembly 50, damages to the second cables 102 are further reduced. In at least one embodiment, when viewed along the second direction Y, the third limiting column 533 and the two fourth limiting columns 534 form three vertexes of a triangle. In at least one embodiment, the second cables 102 first extend from one side of the second storage body 30 facing the bottom wall 11, sequentially enter the second connecting member 51, the third connecting member 52, the second adapter member 53, and the fourth connecting member 54.

The second structural assembly 50 further includes a second base member 55. The base member 55 is fixed to the bottom wall 11. The second base member 55 includes a second protrusion 551. When the second structural assembly 50 is folded, the second protrusion 551 is resisted against the fourth connecting member 54 to limit the position of the second structural assembly 50.

In at least one embodiment, a thickness of the second structural assembly 50 along the second direction Y is defined as h2, and 14 mm≤h2≤27 mm. For example, h2 may be, but not limited to 14 mm, 15 mm, 16 mm, 17 mm, 18 mm, 19 mm, 20 mm, 21 mm, 22 mm, 23 mm, 24 mm, 25 mm, 26 mm, or 27 mm. A height of the first gap 30*a* along the second direction Y is greater than or equal to the thickness h2 of the second structural assembly 50.

Figure 13:
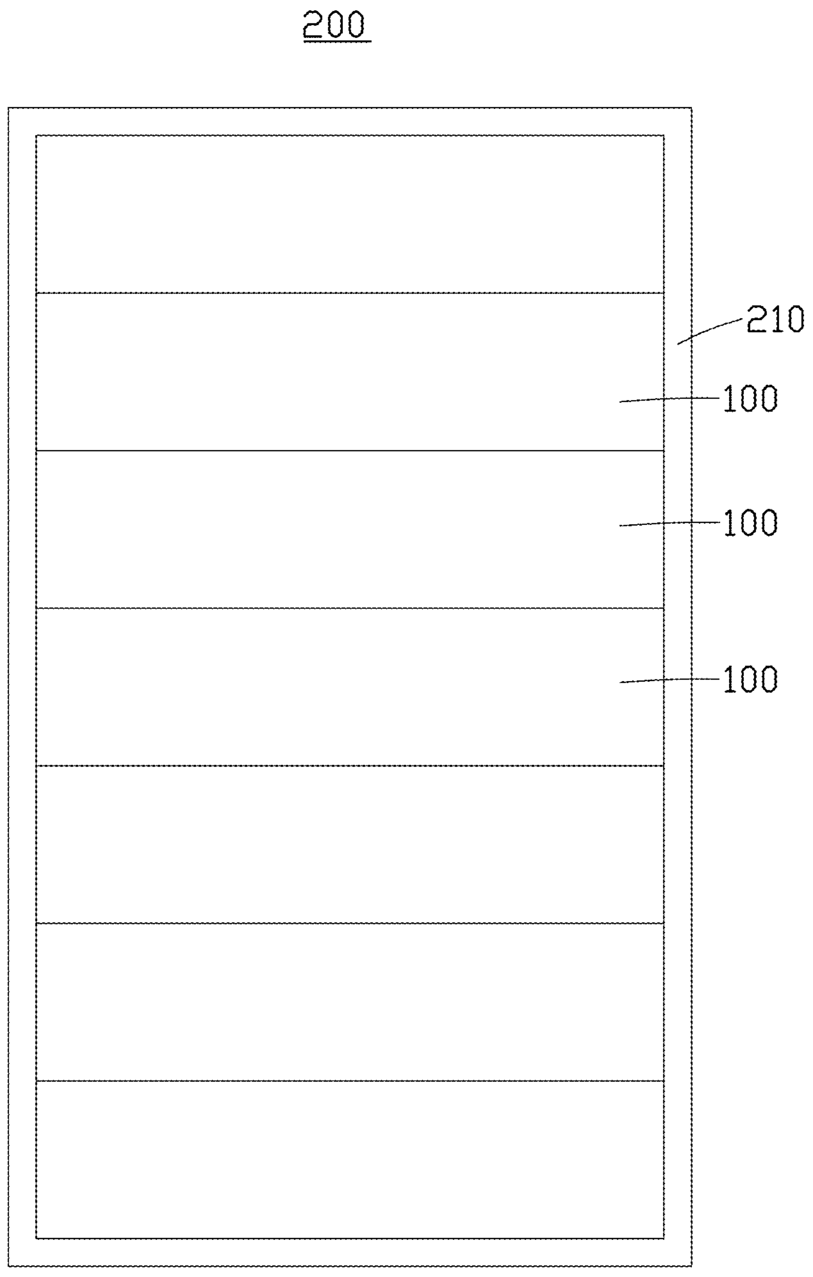
FIG. 13 is a diagrammatic view of a cabinet according to an embodiment of the present disclosure.

Referring to FIG. 13, a cabinet 200 is further provided according to an embodiment of the present disclosure. The cabinet 200 includes a cabinet body 210 and the storage device 100 as mentioned above. The sidewall 12 is fixed to the cabinet body 210, thereby allowing the storage device 100 to install inside the cabinet body 210.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A storage device comprising:

a housing comprising a bottom wall and two sidewalls each connected to the bottom wall;

a first storage body slidably connected to the two sidewalls and configured to receive a first module, the first module having a plurality of first cables;

a second storage body slidably connected to the two sidewalls and configured to receive a second module, the second module having a plurality of second cables, the second storage body and the first storage body arranged along a first direction, the second storage body and the bottom wall arranged along a second direction perpendicular to the first direction, and the second storage body and the bottom wall cooperatively defining a first gap along the second direction;

a first structural assembly located in the first gap and connected to the first storage body and the bottom wall, the first structural assembly configured to partially receive the plurality of first cables, and the first structural assembly further configured to unfold when the first storage body moves along the first direction away from the second storage body; and a second structural assembly located in the first gap and connected to the second storage body and the bottom wall, the second structural assembly configured to partially receive the plurality of second cables, and the second structural assembly further configured to unfold when the second storage body moves along the first direction toward the first storage body.

2. The storage device of claim 1, wherein the first structural assembly comprises a first fixing member, a first connecting member, a first adapter member, and a second connecting member, the first fixing member is fixed to the first storage body, the first connecting member is rotatably connected to the first fixing member and the first adapter member, and the second connecting member is rotatably connected to the first adapter member and the bottom wall.

3. The storage device of claim 2, wherein a width of the first connecting member is greater than a thickness of the first connecting member.

4. The storage device of claim 2, wherein the first connecting member comprises a first base portion and a first cover, the first cover is connected to the first base portion, the first base portion is rotatably connected to the first adapter member, the first cover is rotatably connected to the first fixing member, and the plurality of first cables is located between the first cover and the first base portion as a single layer.

5. The storage device of claim 4, wherein the second connecting member comprises a second base portion and a second cover, the second cover is connected to the second base portion, the second base portion is rotatably connected to the first adapter member, at least one of the second base portion and the second cover is rotatably connected to the bottom wall, and the plurality of first cables is located between the second cover and the second base portion as a single layer.

6. The storage device of claim 2, wherein the first structural assembly further comprises a first base member, the first base member is fixed to the bottom wall, the first base comprises a first protrusion, and the first protrusion is configured to resist against the second connecting member.

7. The storage device of claim 6, wherein the first structural assembly further comprises a guiding member, one side of the guiding member is rotatably connected to the first base member, another side of the guiding member is locked to the first base member, the guiding member and the first base member cooperatively define a first space, and the first space is configured to receive the plurality of first cables.

8. The storage device of claim 2, wherein the first adapter member comprises a first limiting column, and the plurality of first cables is bent around the first limiting column.

9. The storage device of claim 1, wherein a thickness of the first structural assembly is denoted as h1, and 14 mm≤h1≤27 mm.

10. The storage device of claim 1, wherein the second structural assembly comprises a second fixing member, a third connecting member, a second adapter member, and a fourth connecting member, the second fixing member is fixed to the second storage body, the third connecting member is rotatably connected to the second fixing member and the second adapter member, and the fourth connecting member is rotatably connected to the second adapter member and the bottom wall.

11. A cabinet comprising:

a cabinet body; and a storage device comprising:

a housing comprising a bottom wall and two sidewalls connected to the bottom wall, the two sidewalls fixed to the cabinet body;

a first storage body slidably connected to the two sidewalls and configured to receive a first module, the first module having a plurality of first cables;

a second storage body slidably connected to the two sidewalls and configured to receive a second module, the second module having a plurality of second cables, the second storage body and the first storage body arranged along a first direction, the second storage body and the bottom wall arranged along a second direction perpendicular to the first direction, and the second storage body and the bottom wall cooperatively defining a first gap along the second direction;

a first structural assembly located in the first gap and connected to the first storage body and the bottom wall, the first structural assembly configured to partially receive the plurality of first cables, and the first structural assembly further configured to unfold when the first storage body moves along the first direction away from the second storage body; and a second structural assembly located in the first gap and connected to the second storage body and the bottom wall, the second structural assembly configured to partially receive the plurality of second cables, and the second structural assembly further configured to unfold when the second storage body moves along the first direction toward the first storage body.

12. The cabinet of claim 11, wherein the first structural assembly comprises a first fixing member, a first connecting member, a first adapter member, and a second connecting member, the first fixing member is fixed to the first storage body, the first connecting member is rotatably connected to the first fixing member and the first adapter member, and the second connecting member is rotatably connected to the first adapter member and the bottom wall.

13. The cabinet of claim 12, wherein a width of the first connecting member is greater than a thickness of the first connecting member.

14. The cabinet of claim 12, wherein the first connecting member comprises a first base portion and a first cover, the first cover is connected to the first base portion, the first base portion is rotatably connected to the first adapter member, the first cover is rotatably connected to the first fixing member, and the plurality of first cables is located between the first cover and the first base portion as a single layer.

15. The cabinet of claim 14, wherein the second connecting member comprises a second base portion and a second cover, the second cover is connected to the second base portion, the second base portion is rotatably connected to the first adapter member, at least one of the second base portion and the second cover is rotatably connected to the bottom wall, and the plurality of first cables is located between the second cover and the second base portion as a single layer.

16. The cabinet of claim 12, wherein the first structural assembly further comprises a first base member, the first base member is fixed to the bottom wall, the first base comprises a first protrusion, and the first protrusion is configured to resist against the second connecting member.

17. The cabinet of claim 16, wherein the first structural assembly further comprises a guiding member, one side of the guiding member is rotatably connected to the first base member, another side of the guiding member is locked to the first base member, the guiding member and the first base member cooperatively define a first space, and the first space is configured to receive the plurality of first cables.

18. The cabinet of claim 12, wherein the first adapter member comprises a first limiting column, and the plurality of first cables is bent around the first limiting column.

19. The cabinet of claim 11, wherein a thickness of the first structural assembly is denoted as h1, and 14 mm≤h1≤27 mm.

20. The cabinet of claim 11, wherein the second structural assembly comprises a second fixing member, a third connecting member, a second adapter member, and a fourth connecting member, the second fixing member is fixed to the second storage body, the third connecting member is rotatably connected to the second fixing member and the second adapter member, the fourth connecting member is rotatably connected to the second adapter member and the bottom wall.

* * * * *